United States Patent
Gates, Jr. et al.

(10) Patent No.: US 8,524,360 B2
(45) Date of Patent: Sep. 3, 2013

(54) CUTTING INSERT WITH A TITANIUM OXYCARBONITRIDE COATING AND METHOD FOR MAKING THE SAME

(75) Inventors: Alfred S. Gates, Jr., Greensburg, PA (US); Zhigang Ban, Latrobe, PA (US)

(73) Assignee: Kennametal Inc., Latrobe, PA (US)

(*) Notice: Subject to any disclaimer, the term of this patent is extended or adjusted under 35 U.S.C. 154(b) by 0 days.

(21) Appl. No.: 13/219,789

(22) Filed: Aug. 29, 2011

(65) Prior Publication Data
US 2013/0052455 A1    Feb. 28, 2013

(51) Int. Cl.
*B32B 9/00*    (2006.01)

(52) U.S. Cl.
USPC ............... 428/325; 51/307; 51/309; 428/698; 428/701; 428/702

(58) Field of Classification Search
USPC ................... 51/307, 309; 428/325, 698, 701, 428/702
See application file for complete search history.

(56) References Cited

U.S. PATENT DOCUMENTS

| | | | |
|---|---|---|---|
| 5,681,651 A | 10/1997 | Yoshimura | |
| 5,915,162 A | 6/1999 | Uchino et al. | |
| 6,183,846 B1 * | 2/2001 | Moriguchi et al. | 428/702 |
| 6,187,421 B1 * | 2/2001 | Moriguchi et al. | 428/701 |
| 6,436,519 B2 | 8/2002 | Holzschun | |
| 6,627,335 B2 * | 9/2003 | Kodama et al. | 51/309 |
| 7,172,807 B2 * | 2/2007 | Fukano et al. | 51/307 |
| 7,192,660 B2 | 3/2007 | Ruppi | |
| 7,455,918 B2 | 11/2008 | Gates, Jr. et al. | |
| 8,080,312 B2 * | 12/2011 | McNerny et al. | 428/325 |
| 8,080,323 B2 * | 12/2011 | Ban et al. | 428/698 |
| 2006/0115662 A1 | 6/2006 | Ruppi | |
| 2006/0257689 A1 | 11/2006 | Sottke et al. | |
| 2007/0298280 A1 | 12/2007 | Omori et al. | |
| 2010/0255345 A1 | 10/2010 | Ban et al. | |
| 2012/0225285 A1 | 9/2012 | Ban et al. | |

FOREIGN PATENT DOCUMENTS

| | | |
|---|---|---|
| EP | 0900860 A2 | 3/1999 |
| EP | 0709484 B1 | 4/1999 |
| EP | 0685572 B1 | 7/2000 |
| EP | 0732423 B1 | 6/2001 |
| EP | 1138800 A1 | 10/2001 |
| EP | 1160353 A1 | 12/2001 |
| EP | 1157143 B1 | 11/2002 |
| EP | 1188504 | 11/2004 |
| EP | 1413648 B1 | 6/2005 |
| JP | 08269719 A | 10/1996 |
| WO | 0052224 | 9/2000 |

OTHER PUBLICATIONS

Moltrecht, Machine Shop Practice, New York, New York, (1981) pp. 199-204.
ASTE Tool Engineers Handbook, McGraw Hill Book Co. New Your, New Your, (1949) pp. 302-315.
Dec. 19, 2012—GBSearch Report.

* cited by examiner

*Primary Examiner* — Archene Turner
(74) *Attorney, Agent, or Firm* — Matthew W. Gordon, Esq.

(57) ABSTRACT

A method for making a coated cutting insert, as well as the coated cutting insert, includes a step of providing a substrate which has a surface, and depositing a CVD coating layer of titanium oxycarbonitride. The gaseous mixture from which the coating layer of titanium oxycarbonitride is deposited has a composition of nitrogen, methane hydrogen chloride, titanium tetrachloride, acetonitrile, carbon monoxide, and hydrogen. The coating layer of titanium oxycarbonitride comprises titanium oxycarbonitride whiskers having as measured in a two-dimensional plane view an average length greater than about 1.0 μm, an average width greater than about 0.2 μm, and an average aspect ratio greater than about 2.0.

15 Claims, 6 Drawing Sheets

US 8,524,360 B2

CUTTING INSERT WITH A TITANIUM OXYCARBONITRIDE COATING AND METHOD FOR MAKING THE SAME

BACKGROUND OF THE INVENTION

The invention pertains to a coated cutting insert with a coating scheme and a method for making the same wherein the coating scheme includes a coating layer of titanium oxycarbonitride. More specifically, the invention pertains to a coated cutting insert (wherein the substrate may be polycrystalline cubic boron nitride (PcBN)) with a coating scheme and a method for making the same wherein the coating scheme includes a coating layer of titanium oxycarbonitride deposited by chemical vapor deposition (CVD) from a gaseous mixture including acetonitrile, especially acetonitrile in an amount not greater than about 0.15 Mole percent of the gaseous mixture. Further, the invention pertains to a coated cutting insert (wherein the substrate may be polycrystalline cubic boron nitride (PcBN)) with a coating scheme includes a coating layer of titanium oxycarbonitride applied by CVD wherein the titanium oxycarbonitride whiskers have, as measured in the two-dimensional plane view per the technique set forth hereinafter, an average length greater than about 1.0 μm, an average width greater than about 0.2 μm, and an average aspect ratio greater than about 2.0.

Heretofore, acetonitrile ($CH_3CN$) has been used in a gaseous mixture to deposit via CVD a coating layer. U.S. Pat. No. 7,455,918 to Gates, Jr. et al. lists a number of gaseous compositions, which include acetonitrile, that can be used to deposit a modification layer comprising multiple layers including titanium oxycarbonitride. See Col. 6, lines 48-67. Specific examples are set forth in Table 5 and Table 6 of U.S. Pat. No. 7,455,918 to Gates, Jr. et al. that include an undisclosed volume of acetonitrile in a gaseous mixture of hydrogen, nitrogen, titanium tetrachloride, and carbon monoxide. European Patent No. 1 413 648 B1 to Sumitomo Electric Industries, Ltd. appears to show the use of $CH_3CN$ along with other gases to produce a columnar structure which possibly could be TiOCN. See page 3, line 48 through page 4, line 5. The other gases appear to include ones selected from $VCl_4$, $ZrCl_4$, $TiCl_4$, $H_2$, $N_2$, Ar, CO, and $CO_2$. It appears the gaseous mixture requires the presence of $H_2O$. Table I (page 8) sets out examples that use from 0.3 to 2.0 volume percent acetonitrile to form the TiCNO coating layer.

For some time, acetonitrile has been a part of a gaseous mixture used to deposit via CVD a coating layer of titanium carbonitride, as well as other coating layers. In this respect, PCT Patent Publication WO 00/52224 to Undercoffer (assigned to Kennametal Inc.) apparently discloses at page 2, line 12 through page 3, line 11 that acetonitrile (along with other gases (e.g., $TiCl_4$ and $H_2$)) has been used in the deposition of titanium carbonitride, which seems to be the focus of PCT Patent Publication WO 00/52224. At page 11, lines 4-12, PCT Patent Publication WO 00/52224 mentions that adding CO or $CO_2$ to the gaseous mixture may result in the production of other titanium-containing coatings including titanium oxycarbonitride (TiOCN).

United States Patent Application Publication No. US2007/0298280 to Omori et al. discloses the use of acetonitrile to deposit a coating layer of titanium carbonitride. There is a general mention about the use of acetonitrile to deposit via CVD a titanium oxycarbonitride coating layer. See Paragraphs [0057] through [0060]. European Patent Application No. 1 138,800 A1 to Kodama et al. focuses on the use of ethane in the production of a hard coating that includes titanium oxycarbonitride. However, there is a mention that one could use acetonitrile in place of ethane in the process. See Paragraphs [0021]-[0024].

European Patent Application No. 1160 353 A1 to Hirakawa et al. discloses a TiCN layer with a concentration gradient wherein the $CH_3CN$ concentration in the gas mixture is one of the factors that impacts the TiCN concentration. In the examples, the TiOCN layer does not use $CH_3CN$ as a component of the gaseous mixture.

United States Patent Application Publication No. US2006/0115662 to Ruppi discloses the use of $CH_3CN$ to make a titanium aluminum oxycarbonitride coating "bonding" layer. See Table I and Table II. United States Patent Application Publication No. US2006/0257689 A1 to Sottke et al. discloses the use of acetonitrile (0.5-2 vol. %) in the deposition of an intermediate layer that could be TiOCN with the Ti replaced at least to some extent by Zr or Hf. U.S. Pat. No. 7,192,660 B2 to Ruppi contains a disclosure that alludes to using $CH_3CN$ to produce a $(Ti_x, Al_y, X_z)(C_u, O_w, N_v)$ coating layer wherein x, u and v are greater than zero and at last one of y, z and w is greater than zero. See Col. 5. lines 53-63.

The following patent documents use acetonitrile in the gaseous mixture to deposit a titanium carbonitride coating layer: European Patent No. 0 732 423 B1 to Moriguchi et al., European Patent No. 1 188 504 to Kato et al., European Patent Application No. 0 900 860 A2 to Ichikawa et al., U.S. Pat. No. 5,681,651 to Yoshimura et al., U.S. Pat. No. 5,915,162 to Uchino et al., U.S. Pat. No. 6,436,519 B2 to Holzschuh, European Patent No. 0 685 572 B1 to Mitsubishi Materials, European Patent No. 1 157 143 B1 Kennametal Inc., and European Patent No. 0 709 484 B1 to Mitsubishi Materials.

Adhesion of the coating scheme to the substrate is an important feature for a coated cutting insert. A coating scheme that has improved adhesion is beneficial to performance. Thus, it would be highly desirable to provide a coated cutting insert that experiences improved adhesion of the coating scheme to the substrate.

In some coating schemes for use with a coated cutting insert, an alumina coating layer is joined to a moderate temperature titanium carbonitride (MT-TiCN) coating layer via a bonding layer. Applicants have discovered that by using a titanium oxycarbonitride coating layer as the bonding layer, which exhibits elongate whiskers of titanium oxycarbonitride with certain dimensions and aspect ratios, there is an improvement in the adhesion of the alumina coating layer as compared to a bonding layer of titanium carbonitride. Thus, it would be highly desirable to provide a coated cutting insert with a coating scheme including titanium oxycarbonitride that provides improved adhesion. Further, it would be highly desirable to provide a coated cutting insert with a coating scheme including titanium oxycarbonitride that provides improved adhesion wherein the titanium oxycarbonitride whiskers have certain dimensions and aspect ratios that facilitate improved adhesion.

In order to achieve the coating layer of titanium oxycarbonitride wherein titanium oxycarbonitride whiskers have, as measured in the two-dimensional plane view per the technique set forth hereinafter, an average length greater than about 1.0 μM, an average width greater than about 0.2 μm, and an average aspect ratio greater than about 2.0, applicants have used a reduced amount of acetonitrile in the gaseous mixture used to deposit the titanium oxycarbonitride coating layer. Applicants have found that the maximum amount of acetonitrile in the gaseous mixture should not be greater than about 0.15 Mol percent of the gaseous mixture. Thus, it would be highly desirable to provide a coated cutting insert with a coating scheme including a titanium oxycarbonitride coating layer wherein the gaseous mixture used to deposit the titanium oxycarbonitride coating layer has a reduced content (i.e., not greater than about 0.15 Mol percent of the gaseous mixture) of acetonitrile.

Applicants have found that there is an advantage to a titanium oxycarbonitride bonding layer, which improves the adherence of the alumina coating layer, at a lower CVD deposition temperature. This is especially true for the CVD deposition of the titanium oxycarbonitride layer on a substrate of polycrystalline cubic boron nitride (PcBN). The PcBN substrate can degrade upon the CVD deposition of the titanium oxycarbonitride layer at too high of a deposition temperature. The lower deposition temperature is below about 1000° C. In one alternative, the CVD deposition temperature is between about 800° C. and about 950° C. In another alternative, the CVD deposition temperature is between about 895° C. and about 925° C.

SUMMARY OF THE INVENTION

In one form, the invention is a method for making a coated cutting insert comprising the steps of: providing a substrate having a surface; depositing by chemical vapor deposition a coating layer of titanium oxycarbonitride from a gaseous mixture comprising: nitrogen present in an amount between about 5 mol percent and about 40 mol percent, methane present in an amount between about 0.5 mol percent and about 8.0 mol percent, hydrogen chloride optionally present in an amount up to about 5.0 mol percent, titanium tetrachloride present in an amount between about 0.2 mol percent and about 3.0 mol percent, acetonitrile present in an amount between about 0.02 mol percent and about 0.15 mol percent, carbon monoxide present in an amount between about 0.4 mol percent and about 2.0 mol percent, and hydrogen present in an amount between about 41.85 mol percent and about 93.88 mol percent.

In still another form, the invention is a coated cutting insert that comprises a substrate, which has a surface and a coating scheme on the surface of the substrate. The coating scheme includes a coating of titanium oxycarbonitride wherein the titanium oxycarbonitride comprises titanium oxycarbonitride whiskers with the titanium oxycarbonitride whiskers having the average length greater than about 1.0 µm, width greater than about 0.2 µm, and the aspect ratio greater than about 2.0, measured in the two-dimensional plane view.

In another form, the invention is a coated cutting insert produced by the process comprising the steps of: providing a substrate with a surface; depositing by chemical vapor deposition a coating layer of titanium oxycarbonitride from a gaseous mixture comprising: nitrogen present in an amount between about 5 mol percent and about 40 mol percent, methane present in an amount between about 0.5 mol percent and about 8.0 mol percent, hydrogen chloride optionally present in an amount up to about 5.0 mol percent, titanium tetrachloride present in an amount between about 0.2 mol percent and about 3.0 mol percent, acetonitrile present in an amount between about 0.02 mol percent and about 0.15 mol percent, carbon monoxide present in an amount between about 0.4 mol percent and about 2.0 mol percent, and hydrogen present in an amount between about 41.85 mol percent and about 93.88 mol percent.

BRIEF DESCRIPTION OF THE DRAWINGS

The following is a brief description of the drawings that form a part of this patent application.

DETAILED DESCRIPTION

Figure 1:
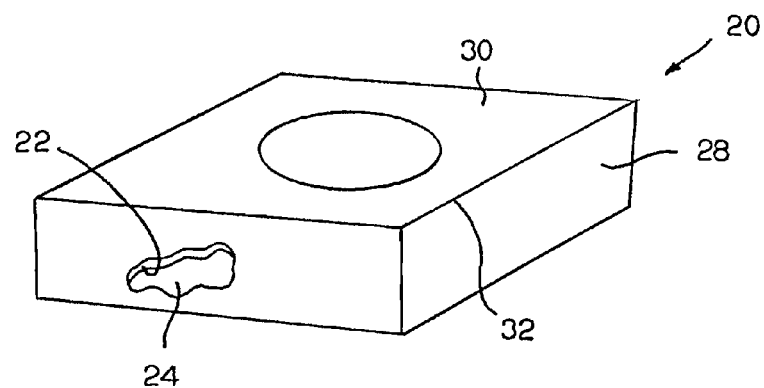
FIG. 1 is an isometric view of a specific embodiment of a cutting insert that has a coating scheme including a CVD-applied coating layer of titanium oxycarbonitride using acetonitrile in the gaseous mixture.

The invention pertains to a coated cutting insert, which has a substrate, with a coating scheme and a method for making the coated cutting insert with the coating scheme. The coating scheme includes a coating layer of titanium oxycarbonitride deposited by chemical vapor deposition (CVD) from a gaseous mixture. One exemplary substrate is a PcBN substrate. As will be described hereinafter, applicants have found advantages (e.g., improved coating adherence) connected with the coating layer of titanium oxycarbonitride whiskers deposited on the surface of the substrate by the inventive process. These advantages pertain to an improved adhesion of the coating scheme to the substrate during a metalcutting operation.

The gaseous mixture includes acetonitrile in an amount not greater than about 0.15 Mol percent of the gaseous mixture used to deposit the coating layer of titanium oxycarbonitride. Further, the gaseous mixture used to deposit the coating layer of titanium oxycarbonitride contains the following gases: nitrogen, methane, hydrogen chloride (optional), titanium tetrachloride, carbon monoxide, acetonitrile, and hydrogen.

In reference to the composition of the gaseous mixture to deposit the titanium oxycarbonitride coating layer, as one option the gaseous mixture comprises: nitrogen present in an amount between about 5 mol percent and about 40 mol percent, methane present in an amount between about 0.5 mol percent and about 8.0 mol percent, hydrogen chloride optionally present in an amount up to about 5.0 mol percent, titanium tetrachloride present in an amount between about 0.2 mol percent and about 3.0 mol percent, acetonitrile present in an amount between about 0.02 mol percent and about 0.15 mol percent, carbon monoxide present in an amount between about 0.4 mol percent and about 2.0 mol percent, and hydrogen present in an amount between about 41.85 mol percent and about 93.88 mol percent.

As another option for the composition of the gaseous mixture to deposit the titanium oxycarbonitride coating layer, the composition comprises nitrogen present in an amount between about 10 mol percent and about 35 mol percent, methane present in an amount between about 1 mol percent and about 6.0 mol percent, hydrogen chloride optionally present in an amount up to about 4.0 mol percent, titanium tetrachloride present in an amount between about 0.5 mol percent and about 2.5 mol percent, acetonitrile present in an amount between about 0.02 mol percent and about 0.1 mol percent, carbon monoxide present in an amount between about 0.4 mol percent and about 1.8 mol percent, and hydrogen present in an amount between about 50.6 mol percent and about 88.08 mol percent. As still another option for the composition of the gaseous mixture to deposit the titanium oxycarbonitride coating layer, the composition comprises nitrogen present in an amount between about 15 mol percent and about 30 mol percent, methane present in an amount between about 1 mol percent and about 5.0 mol percent, hydrogen chloride optionally present in an amount up to about 3.0 mol percent, titanium tetrachloride present in an amount between about 0.5 mol percent and about 2.0 mol percent, acetonitrile present in an amount between about 0.02 mol percent and about 0.08 mol percent, carbon monoxide present in an amount between about 0.40 mol percent and about 1.5 mol percent, and hydrogen present in an amount between about 58.87 mol percent and about 83.08 mol percent.

As another option for the composition of the gaseous mixture to deposit the titanium oxycarbonitride coating layer, the composition comprises nitrogen present in an amount equal to about 25.4 mol percent, methane present in an amount equal to about 1.7 mol percent, hydrogen chloride present in an amount equal to about 1.4 mol percent, titanium tetrachloride present in an amount equal to about 0.7 mol percent, acetonitrile present in an amount equal to about 0.03 mol percent, carbon monoxide present in an amount equal to about 0.6 mol percent, and hydrogen present in an amount equal to about 70.2 mol percent. As yet another option for the composition of the gaseous mixture to deposit the titanium oxycarbonitride coating layer, the composition comprises nitrogen present in an amount between about 26 mol percent and about 28 mol percent, methane present in an amount between about 4 mol percent and about 5 mol percent, hydrogen chloride present in an amount between about 1.6 mol percent and about 2.0 mol percent, titanium tetrachloride present in an amount between about 0.7 mol percent and about 1.0 mol percent, acetonitrile present in an amount between about 0.04 mol percent and about 0.06 mol percent, carbon monoxide present in an amount between about 0.7 mol percent and about 1.1 mol percent, and hydrogen present in an amount between about 62.84 mol percent and about 66.96 mol percent. As another option for the composition of the gaseous mixture to deposit the titanium oxycarbonitride coating layer, the composition comprises nitrogen present in an amount equal to about 27 mol percent, methane present in an amount equal to about 4.5 mol percent, hydrogen chloride present in an amount equal to about 1.8 mol percent, titanium tetrachloride present in an amount equal to about 0.8 mol percent, acetonitrile present in an amount equal to about 0.05 mol percent, carbon monoxide present in an amount equal to about 0.9 mol percent, and hydrogen present in an amount equal to about 64.9 mol percent.

In reference to the properties of the coating layer of titanium oxycarbonitride, the composition of $Ti(O_xC_yN_z)$ has a range as follows: x ranges between about 0.005 and about 0.15, y ranges between about 0.3 and about 0.8, and z ranges between about 0.2 and about 0.8. As a alternative, x ranges between about 0.01 and about 0.1, y ranges between about 0.3 and about 0.6, and z ranges between about 0.3 and about 0.7. The titanium oxycarbonitride takes on the form of whiskers. In this situation, the term "whiskers" means an elongate monocrystalline form of titanium oxycarbonitride wherein the aspect ratio of length to width is greater than about 2 in the plane view parallel to the substrate surface. In one alternative, the aspect ratio of length to width is greater than about 4. In still another alternative, the aspect ratio of length to width is greater than about 6.

The technique to measure the aspect ratio of length to width, which includes the measurement of the length and the width, is via a secondary electron microscope using 5,000× magnification and a field of view equal to 20 micrometers by 24 micrometers. One line is randomly drawn on the field of view and the grains intercepted by this line is used for measurement of their length and width, which can be used to calculate the aspect ratio (aspect ratio=length/width). Repeat this procedure for five photographs. The aspect ratios of all intercepted grains are then averaged as the final aspect ratio.

Referring to the drawings, FIG. 1 shows a coated cutting insert generally designated as 20. A portion of the coating scheme 22 is absent from the coated cutting insert 20 so expose the substrate 24. The coated cutting insert 20 has flank surface 28 and a rake surface 30. A cutting edge 32 is at the intersection (or juncture) of the flank surfaces 28 and the rake surface 30. There is no intention to restrict the scope of the invention to the specific geometry of the coated cutting insert 20. The invention is applicable to a cutting insert of any geometry. The typical use of the coated cutting insert 20 is in the removal of material from a workpiece, e.g., chipforming machining of a workpiece.

In reference to the chipforming machining operation, material removal operations generate chips of the workpiece material. Publications that pertain to machining establish this fact. For example, the book *Machine Shop Practice* [Industrial Press Inc., New York, N.Y. (1981)] by Moltrecht, presents at pages 199-204 a description, inter alia, of chip formation, as well as different kinds of chips (i.e., continuous chip, discontinuous chip, segmental chip). Moltrecht reads [in part] at pages 199-200:

> When the cutting tool first makes contact with the metal, it compresses the metal ahead of the cutting edge. As the tool advances, the metal ahead of the cutting edge is stressed to the point where it will shear internally, causing the grains of the metal to deform and to flow plastically along a plane called the shear plane . . . . When the type of metal being cut is ductile, such as steel, the chip will come off in a continuous ribbon . . . .

Moltrecht goes on to describe formation of a discontinuous chip and a segmented chip. As another example, the text found at pages 302-315 of the *ASTE Tool Engineers Handbook*, McGraw Hill Book Co., New York, N.Y. (1949) provides a lengthy description of chip formation in the metal cutting process. At page 303, the ASTE Handbook makes the clear connection between chip formation and machining operations such as turning, milling and drilling.

Figures 2, 2A:
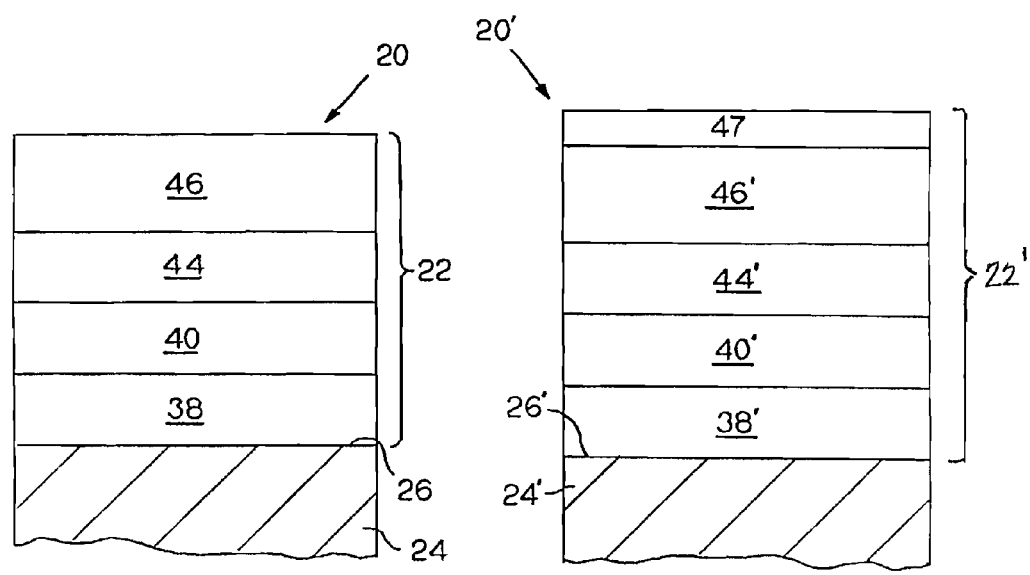
FIG. 2 is a cross-sectional mechanical schematic view showing the substrate of the cutting insert of FIG. 1 and the coating scheme thereon.
FIG. 2A is a cross-sectional mechanical schematic view of another specific embodiment of a coating scheme on a substrate.

Referring to FIG. 2, there is shown a cross-sectional mechanical schematic view showing the substrate 24 of the cutting insert of FIG. 1 and the coating scheme (bracket 22) thereon. The substrate 24 can be any one of a number of substrate materials suitable for use as a cutting insert. Exemplary substrates include without limitation cemented carbides (e.g., tungsten carbide-cobalt materials), ceramics (e.g., silicon nitrides, and SiAlON ceramics), polycrystalline cubic boride (PcBN) materials, and cermets (e.g., titanium carbide-based materials). The substrate 24 has a surface 36.

A coating layer of titanium nitride 38 is deposited by CVD on the surface 36 of the substrate 24. The gaseous mixture from which the coating layer of titanium nitride 38 is deposited typically comprises (including volume in mol percentages of the gaseous mixture): $TiCl_{a4}$ (0.93 mol %), $N_2$ (18.08 mol %) and $H_2$ (79.11 mol %). The typical temperature range for the CVD deposition of the coating layer of titanium nitride 38 comprises between about 800° C. and about 950° C. Another temperature range for the CVD deposition of the coating layer of titanium nitride 38 comprises between about 850° C. and about 920° C. A preferred temperature for the CVD deposition of the coating layer of titanium nitride 38 equals about 890° C. A typical pressure range for the CVD deposition of the titanium nitride coating layer ranges between about 60 torr and about 380 torr. Another pressure range for the CVD deposition of the titanium nitride coating layer ranges between about 80 torr and about 150 torr. A typical duration range for the CVD deposition of the titanium nitride coating layer ranges between about 10 minutes and about 60 minutes. An alternate duration range for the CVD deposition of the titanium nitride coating layer ranges between about 20 minutes and about 50 minutes. The thickness of the coating layer of titanium nitride 38 is about 0.5 micrometer. One range for the thickness of the coating layer of titanium nitride is between about 0.1 micrometer and about 2 micrometers. Another range for the thickness of the coating layer of titanium nitride is between about 0.2 micrometer and about 1 micrometer.

There should be an appreciation that coatings other than titanium nitride may be deposited in place of the titanium nitride. These coatings for this mediate coating layer (other than titanium nitride) can comprise one or more selected from the group of: titanium carbide, titanium carbonitride, hafnium nitride, hafnium carbide, hafnium carbonitride, zirconium nitride, zirconium carbide, and zirconium carbonitride.

A coating layer of MT-CVD titanium carbonitride 40 is deposited by MT-CVD on top of the coating layer of titanium nitride 38. The gaseous mixture from which the coating layer of titanium carbonitride 40 is deposited typically comprises (including volume in mol percentages of the gaseous mixture): $TiCl_4$ (0.99 mol %), $N_2$ (18.96 mol %) and $H_2$ (73.74 mol %), $CH_3CN$ (0.34 mol %), and HCl (0.41 mol %). The typical temperature range for the CVD deposition of the coating layer of titanium carbonitride 40 comprises between about 750° C. and about 950° C. Another temperature range for the CVD deposition of the coating layer of titanium carbonitride 40 comprises between about 770° C. and about 900° C. A preferred temperature for the CVD deposition of the coating layer of titanium carbonitride 40 equals about 890° C. A typical pressure range for the CVD deposition of the titanium carbonitride coating layer ranges between about 40 torr and about 150 torr. Another pressure range for the CVD deposition of the titanium carbonitride coating layer ranges between about 40 torr and about 100 torr. A typical duration range for the CVD deposition of the titanium carbonitride coating layer ranges between about 60 minutes and about 360 minutes. An alternate duration range for the CVD deposition of the titanium carbonitride coating layer ranges between about 60 minutes and about 180 minutes. The thickness of the coating layer of titanium carbonitride 40 is about 7 micrometers. One range for the thickness of the coating layer of titanium carbonitride 40 is between about 2 micrometers and about 12 micrometers. Another range for the thickness of the coating layer of titanium carbonitride 40 is between about 3 micrometers and about 9 micrometers.

There should be an appreciation that coatings other than titanium carbonitride may be deposited in place of the titanium carbonitride. These coatings for this mediate coating layer (other than titanium carbonitride) can comprise one or more selected from the group of: titanium carbide, titanium nitride, hafnium nitride, hafnium carbide, hafnium carbonitride, zirconium nitride, zirconium carbide, and zirconium carbonitride.

The coating layer of titanium oxycarbonitride 44 is deposited by CVD on the surface of the coating layer of titanium carbonitride 40. The gaseous mixture from which the coating layer of titanium oxycarbonitride 44 is deposited is shown in Table 13. The typical temperature range for the CVD deposition of the coating layer of titanium oxycarbonitride 44 comprises between about 800° C. and about 950° C. Another temperature range for the CVD deposition of the coating layer of titanium oxycarbonitride 44 comprises between about 850° C. and about 920° C. A preferred temperature for the CVD deposition of the coating layer of titanium oxycarbonitride 44 equals about 900° C. A typical pressure range for the CVD deposition of the titanium oxycarbonitride coating layer ranges between about 60 torr and about 500 torr. Another pressure range for the CVD deposition of the titanium oxycarbonitride coating layer ranges between about 120 torr and about 400 torr. Thus, it can be seen that one set of parameters for the depositing step for the coating layer of titanium oxycarbonitride comprises a temperature equal to between about 800° C. and about 950° C. and a pressure equal to between about 60 torr and about 500 torr. Another set of parameters for the depositing of the coating layer of titanium oxycarbonitride comprises a temperature equal to between about 895° C. and about 925° C. and a pressure equal to between about 120 torr and about 400 torr.

A typical duration range for the CVD deposition of the titanium oxycarbonitride coating layer ranges between about 25 minutes and about 120 minutes. An alternate duration range for the CVD deposition of the titanium oxycarbonitride coating layer ranges between about 40 minutes and about 90 minutes. The thickness of the coating layer of titanium oxycarbonitride 44 is about 0.6 to about 0.7 microns. One range for the thickness of the coating layer of titanium oxycarbonitride 44 is between about 0.3 micrometers and about 2 micrometers. Another range for the thickness of the coating layer of titanium oxycarbonitride 44 is between about 0.5 micrometers and about 1.2 micrometers.

There should be an appreciation that an intervening coating layer can be deposited so as to be between the titanium nitride coating layer and the titanium carbonitride coating layer. Further, there should be an appreciation that an intervening coating layer can be deposited so as to between the titanium carbonitride coating layer and the titanium oxycarbonitride coating layer. The intervening coating layer can comprise any one or more of a number of compositions such as, for example, titanium nitride, titanium carbide, titanium carbonitride, hafnium nitride, hafnium carbide, hafnium carbonitride, zirconium nitride, zirconium carbide, and zirconium carbonitride.

A coating layer of alpha-alumina 46 is deposited by CVD on the surface of the coating layer of titanium oxycarbonitride 44. The gaseous mixture from which the coating layer of alpha-alumina 46 is deposited typically comprises (including volume in mol percentages of the gaseous mixture): $AlCl_3$ (1.53 mol %), $CO_2$ (9.18 mol %) and $H_2$ (84.95 mol %), $H_2S$ (0.13 mol %), and HCl (2.3 mol %). The typical temperature range for the CVD deposition of the coating layer of alpha-alumina 46 comprises between about 800° C. and about 950° C. Another temperature range for the CVD deposition of the coating layer of alpha-alumina 46 comprises between about 850° C. and about 920° C. A preferred temperature for the CVD deposition of the coating layer of alpha-alumina 46 equals about 900° C. A typical pressure range for the CVD deposition of the alpha-alumina coating layer ranges between about 40 torr and about 150 torr. Another pressure range for the CVD deposition of the alpha-alumina coating layer ranges between about 60 torr and about 90 torr. A typical duration range for the CVD deposition of the alpha-alumina coating layer ranges between about 60 minutes and about 600 minutes. An alternate duration range for the CVD deposition of the alpha-alumina coating layer ranges between about 120 minutes and about 360 minutes. The thickness of the coating layer of alpha-alumina 46 is about 7 micrometers. One range for the thickness of the coating layer of alpha-alumina 46 is between about 1 micrometers and about 10 micrometers. Another range for the thickness of the coating layer of alpha-alumina 46 is between about 3 micrometers and about 8 micrometers.

Referring to FIG. 2A, there is shown another specific embodiment 20' of a coating scheme 22' on a substrate 24'. The coating scheme 22' includes coating layers 38' (a coating layer of titanium nitride), 40' (a coating layer of MT-CVD titanium carbonitride), 44' (a coating layer of titanium oxycarbonitride), and 46' (a coating layer of alpha-alumina). These coating layers 38', 40', 44' and 46' are essentially the same as coating layers 38, 40, 44 and 46, respectively, described hereinabove in conjunction with FIG. 2.

The coating scheme 22' of FIG. 2A further includes an outermost coating layer of titanium nitride 47. In reference to the processing parameters to deposit the titanium nitride coating layer, the gaseous mixture from which the coating layer of titanium nitride is deposited typically comprises (including volume in mol percentages of the gaseous mixture): $TiCl_4$ (0.93 mol %), $N_2$ (18.08 mol %) and $H_2$ (79.11 mol %). The typical temperature range for the CVD deposition of the coating layer of titanium nitride comprises between about 800° C. and about 950° C. Another temperature range for the CVD deposition of the coating layer of titanium nitride comprises between about 850° C. and about 920° C. A preferred temperature for the CVD deposition of the coating layer of titanium nitride equals about 890° C. A typical pressure range for the CVD deposition of the titanium nitride coating layer ranges between about 60 torr and about 380 torr. Another pressure range for the CVD deposition of the titanium nitride coating layer ranges between about 80 torr and about 150 torr. A typical duration range for the CVD deposition of the titanium nitride coating layer ranges between about 10 minutes and about 60 minutes. An alternate duration range for the CVD deposition of the titanium nitride coating layer ranges between about 20 minutes and about 50 minutes. The thickness of the coating layer of titanium nitride is about 0.5 micrometer. One range for the thickness of the coating layer of titanium nitride is between about 0.1 micrometer and about 2 micrometers. Another range for the thickness of the coating layer of titanium nitride is between about 0.2 micrometer and about 1 micrometer.

Applicants contemplate that rather than using an overlayer of titanium nitride on the alumina coating layer, any one of the following overlayer coating schemes could be used: titanium oxycarbonitride/titanium nitride; titanium nitride/titanium carbonitride/titanium nitride; titanium oxycarbonitride/titanium carbonitride/titanium nitride; multilayers of titanium oxycarbonitride/titanium nitride; and multilayers of titanium oxycarbonitride/titanium carbonitride. The process parameters for these various coating materials are the same as those already described herein for these materials.

Figure 3:
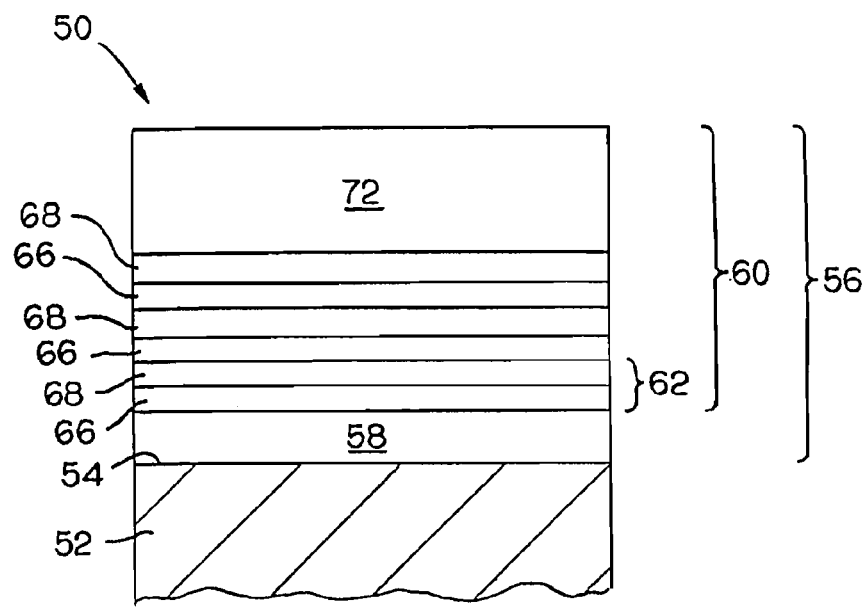
FIG. 3 is a cross-sectional mechanical schematic view of still another specific embodiment of a coating scheme on a substrate.

FIG. 3 is a cross-sectional mechanical schematic view of a second embodiment of a coated cutting insert generally designated as 50 comprising a substrate 52. The substrate 52 can be any one of a number of substrate materials suitable for use as a cutting insert. The substrate 52 has a surface 54. The substrate surface 54 has a coating scheme 56 thereon. The coating scheme 56 comprises a base coating layer of titanium nitride 58 is deposited by CVD on the surface 54 of the substrate 52. The gaseous mixture from which the coating layer of titanium nitride 58 is deposited typically comprises (including volume in mol percentages of the gaseous mixture): $TiCl_4$ (0.93 mol %), $N_2$ (18.08 mol %) and $H_2$ (79.11 mol %). The typical temperature range for the CVD deposition of the coating layer of titanium nitride 58 comprises between about 800° C. and about 950° C. Another temperature range for the CVD deposition of the coating layer of titanium nitride 58 comprises between about 850° C. and about 920° C. A preferred temperature for the CVD deposition of the coating layer of titanium nitride 58 equals about 890° C. A typical pressure range for the CVD deposition of the titanium nitride coating layer ranges between about 60 torr and about 380 torr. Another pressure range for the CVD deposition of the titanium nitride coating layer ranges between about 80 torr and about 150 torr. A typical duration range for the CVD deposition of the titanium nitride coating layer ranges between about 10 minutes and about 60 minutes. An alternate duration range for the CVD deposition of the titanium nitride coating layer ranges between about 20 minutes and about 50 minutes. The thickness of the coating layer of titanium nitride 58 is about 0.5 micrometer. One range for the thickness of the coating layer of titanium nitride is between about 0.1 micrometer and about 2 micrometers. Another range for the thickness of the coating layer of titanium nitride is between about 0.2 micrometer and about 1 micrometer.

The next region (see bracket 60) of the coating scheme 56 comprises a plurality of pairs (see bracket 62) of coating layers. Each pair of coating layers 62 comprises a coating layer of titanium carbonitride 66 and a coating layer of titanium oxycarbonitride 68. In this embodiment, three are three pairs of coating layers 62. However, there is no intention to restrict the invention to any specific number of pairs of coating layers 62. The typical temperature range for the CVD deposition of the pairs of coating layers 62 is deposited comprises between about 750° C. and about 950° C. Another temperature range for the CVD deposition of the pairs of coating layers 62 comprises between about 770° C. and about 900° C. A preferred temperature for the CVD deposition of the pairs of coating layers 62 equals about 890° C. A typical pressure range for the CVD deposition of the pairs of coating layers ranges between about 40 torr and about 500 torr. Another pressure range for the CVD deposition of the pairs of coating layers ranges between about 60 torr and about 400 torr. A typical duration range for the CVD deposition of the pairs of coating layers ranges between about 10 minutes and about 150 minutes. An alternate duration range for the CVD deposition of the pairs of coating layers ranges between about 40 minutes and about 120 minutes.

For each pair of coating layers 62, the thickness of one pair of coating layers 62 is about 1.5 micrometers. One range for the thickness of one pair of coating layers 62 is between about 0.2 micrometers and about 4 micrometers. Another range for the thickness of one pair of coating layers 62 is between about 0.5 micrometers and about 2 micrometers.

For the coating layer of titanium carbonitride 66, the thickness of the coating layer of titanium carbonitride 66 is about 1.2 micrometers. One range for the thickness of the coating layer of titanium carbonitride is between about 0.2 micrometers and about 4 micrometers. Another range for the thickness of the coating layer of titanium carbonitride is between about 0.5 micrometers and about 2 micrometers. A typical pressure range for the CVD deposition of the titanium carbonitride coating layer ranges between about 40 torr and about 150 torr. Another pressure range for the CVD deposition of the titanium carbonitride coating layer ranges between about 40 torr and about 100 torr. A typical duration range for the CVD deposition of the titanium carbonitride coating layer ranges between about 10 minutes and about 100 minutes. An alternate duration range for the CVD deposition of the titanium carbonitride coating layer ranges between about 20 minutes and about 60 minutes.

For the coating layer of titanium oxycarbonitride 68, the thickness of the coating layer of titanium oxycarbonitride 68 is about 0.3 micrometers. A typical pressure range for the CVD deposition of the titanium oxycarbonitride coating layer ranges between about 60 torr and about 500 torr. Another pressure range for the CVD deposition of the titanium oxycarbonitride coating layer ranges between about 120 torr and about 400 torr. A typical duration range for the CVD deposition of the titanium oxycarbonitride coating layer ranges between about 10 minutes and about 150 minutes. An alternate duration range for the CVD deposition of the titanium oxycarbonitride coating layer ranges between about 20 minutes and about 80 minutes. One range for the thickness of the coating layer of titanium oxycarbonitride is between about 0.1 micrometer and about 2 micrometers. Another range for the thickness of the coating layer of titanium oxycarbonitride is between about 0.2 micrometer and about 1 micrometer.

A coating layer of alpha-alumina 72 is deposited by CVD on the surface of the outermost pair of coating layer 62. The gaseous mixture from which the coating layer of alpha-alumina 72 is deposited typically comprises (including volume in mol percentages of the gaseous mixture): $AlCl_3$ (1.53 mol %), $CO_2$ (9.18 mol %) and $H_2$ (84.95 mol %), $H_2S$ (0.13 mol %), and HCl (2.3 mol %). The typical temperature range for the CVD deposition of the coating layer of alpha-alumina 72 comprises between about 800° C. and about 950° C. Another temperature range for the CVD deposition of the coating layer of alpha-alumina 72 comprises between about 850° C. and about 920° C. A preferred temperature for the CVD deposition of the coating layer of alpha-alumina 72 equals about 900° C. A typical pressure range for the CVD deposition of the alpha-alumina coating layer ranges between about 40 torr and about 150 torr. Another pressure range for the CVD deposition of the alpha-alumina coating layer ranges between about 60 torr and about 90 torr. A typical duration range for the CVD deposition of the alpha-alumina coating layer ranges between about 60 minutes and about 600 minutes. An alternate duration range for the CVD deposition of the alpha-alumina coating layer ranges between about 120 minutes and about 360 minutes. The thickness of the coating layer of alpha-alumina 72 is about 7 micrometers. One range for the thickness of the coating layer of alpha-alumina 72 is between about 1 micrometer and about 10 micrometers. Another range for the thickness of the coating layer of alpha-alumina 72 is between about 3 micrometers and about 8 micrometers.

Figure 3A:
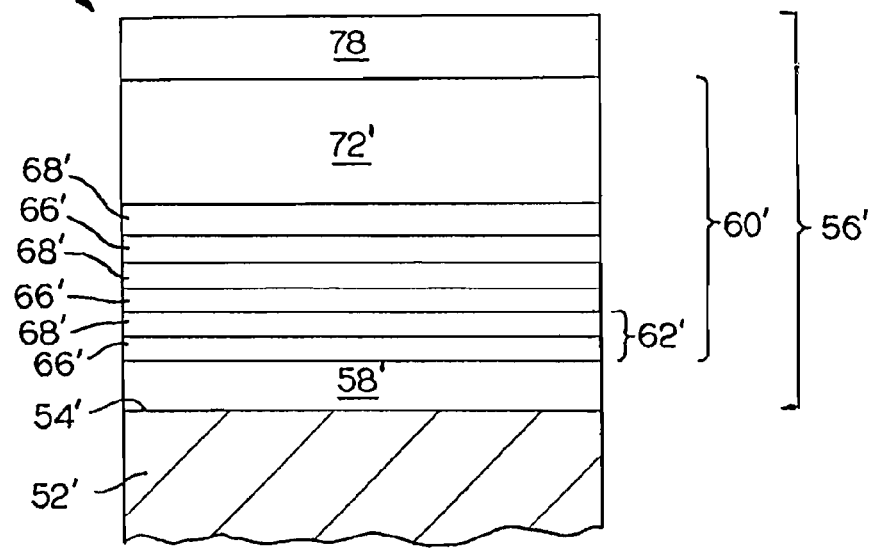
FIG. 3A is a cross-sectional mechanical schematic view of yet another specific embodiment of a coating scheme on a substrate.

Referring to FIG. 3A, there is shown another specific embodiment 50' of a coating scheme 56' on a substrate 52'. The coating scheme 56' includes a base coating layer of titanium nitride 58'. The coating scheme 56' further includes a region (bracket 60') that comprises a plurality of pairs (see bracket 62') of coating layers. Each pair of coating layers 62' comprises a coating layer of titanium carbonitride 66' and a coating layer of titanium oxycarbonitride 68'. Even though there are three pairs shown, there is no intention to restrict the number of pairs of coatings to any specific number. The coating scheme 56' further includes a coating layer of alpha-alumina 72', which is deposited on the surface of the outermost pair of coating layers 62'. The coating layers 58', 62', 66', 68' and 72' are essentially the same as the coating layers 58, 62, 66, 68 and 72 described in conjunction with FIG. 3.

The coating scheme 56' of FIG. 3A further includes an outermost coating layer of titanium nitride 78. In reference to the processing parameters to deposit the titanium nitride coating layer, the gaseous mixture from which the coating layer of titanium nitride is deposited typically comprises (including volume in mol percentages of the gaseous mixture): $TiCl_4$ (0.93 mol %), $N_2$ (18.08 mol %) and $H_2$ (79.11 mol %). The typical temperature range for the CVD deposition of the coating layer of titanium nitride comprises between about 800° C. and about 950° C. Another temperature range for the CVD deposition of the coating layer of titanium nitride comprises between about 850° C. and about 920° C. A preferred temperature for the CVD deposition of the coating layer of titanium nitride equals about 890° C. A typical pressure range for the CVD deposition of the titanium nitride coating layer ranges between about 60 torr and about 380 torr. Another pressure range for the CVD deposition of the titanium nitride coating layer ranges between about 80 torr and about 150 torr. A typical duration range for the CVD deposition of the titanium nitride coating layer ranges between about 10 minutes and about 60 minutes. An alternate duration range for the CVD deposition of the titanium nitride coating layer ranges between about 20 minutes and about 50 minutes. The thickness of the coating layer of titanium nitride is about 0.5 micrometer. One range for the thickness of the coating layer of titanium nitride is between about 0.1 micrometer and about 2 micrometers. Another range for the thickness of the coating layer of titanium nitride is between about 0.2 micrometer and about 1 micrometer.

Applicants contemplate that rather than using an overlayer of titanium nitride on the alumina coating layer, any one of the following overlayer coating schemes could be used: titanium oxycarbonitride/titanium nitride; titanium nitride/titanium carbonitride/titanium nitride; titanium oxycarbonitride/titanium carbonitride/titanium nitride; multilayers of titanium oxycarbonitride/titanium nitride; and multilayers of titanium oxycarbonitride/titanium carbonitride. The process parameters for these various coating materials are the same as those already described herein for these materials.

Figure 4:
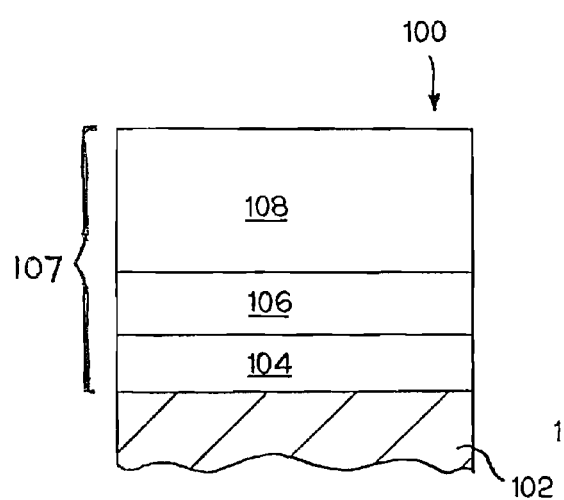
FIG. 4 is a cross-sectional mechanical schematic view of another specific embodiment of a coating scheme on a substrate.

Referring to FIG. 4, there is shown still another specific embodiment 100 of a coating scheme 107 on a substrate 102. The coating scheme 107 comprises a base coating layer of titanium nitride 104 wherein the processing parameters to deposit the coating layer 104 are essentially the same as those used to deposit coating layer 38 of FIG. 2. The coating scheme 107 further includes a coating layer of MT-CVD titanium carbonitride 106, which is on the coating layer of titanium nitride 104. The processing parameters to deposit the coating layer 106 are essentially the same as those used to deposit the MT-CVD titanium carbonitride 40 of FIG. 2. Finally, the coating scheme 107 comprises a region 108 that contains a plurality of pairs of coating layers of titanium oxycarbonitride and alpha-alumina. The processing parameters used to deposit the layer of titanium oxycarbonitride are essentially the same as those used to deposit the coating layer of titanium oxycarbonitride 44 of FIG. 2. The processing parameters used to deposit the layer of alpha-alumina are essentially the same as those used to the deposit the coating layer of alpha-alumina 46 of FIG. 2.

Figure 4A:
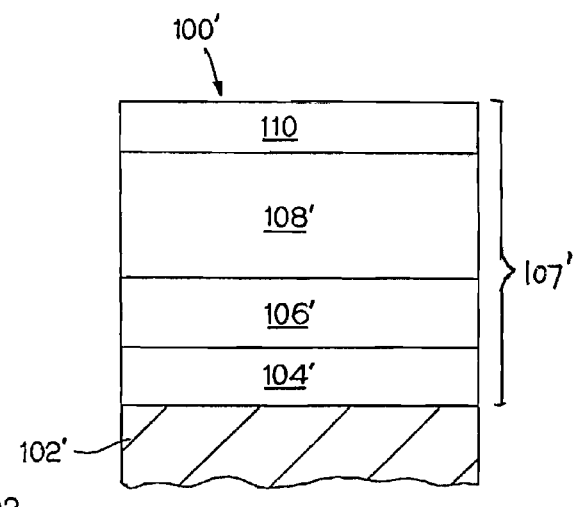
FIG. 4A is a cross-sectional mechanical schematic view of another specific embodiment of a coating scheme on a substrate.

Referring to FIG. 4A, there is shown still another specific embodiment 100' of a coating scheme 107' on a substrate 102'. The coating scheme 107' has a base coating layer of titanium nitride 104', a MT-CVD coating layer of titanium carbonitride 106', and a region 108' comprising a plurality of pairs of coating layers of titanium oxycarbonitride and alpha-alumina. Coating layers 104' and 106' and region 108' are essentially the same as coating layers 104 and 106 and coating region 108 of FIG. 4. Coating scheme 107' further includes an outermost coating layer of titanium nitride 110. In reference to the processing parameters to deposit the titanium nitride coating layer, the gaseous mixture from which the coating layer of titanium nitride is deposited typically comprises (including volume in mol percentages of the gaseous mixture): $TiCl_4$ (0.93 mol %), $N_2$ (18.08 mol %) and $H_2$ (79.11 mol %). The typical temperature range for the CVD deposition of the coating layer of titanium nitride comprises between about 800° C. and about 950° C. Another temperature range for the CVD deposition of the coating layer of titanium nitride comprises between about 850° C. and about 920° C. A preferred temperature for the CVD deposition of the coating layer of titanium nitride equals about 890° C. A typical pressure range for the CVD deposition of the titanium nitride coating layer ranges between about 60 torr and about 380 torr. Another pressure range for the CVD deposition of the titanium nitride coating layer ranges between about 80 torr and about 150 torr. A typical duration range for the CVD deposition of the titanium nitride coating layer ranges between about 10 minutes and about 60 minutes. An alternate duration range for the CVD deposition of the titanium nitride coating layer ranges between about 20 minutes and about 50 minutes. The thickness of the coating layer of titanium nitride is about 0.5 micrometer. One range for the thickness of the coating layer of titanium nitride is between about 0.1 micrometer and about 2 micrometers. Another range for the thickness of the coating layer of titanium nitride is between about 0.2 micrometer and about 1 micrometer.

Figure 5:
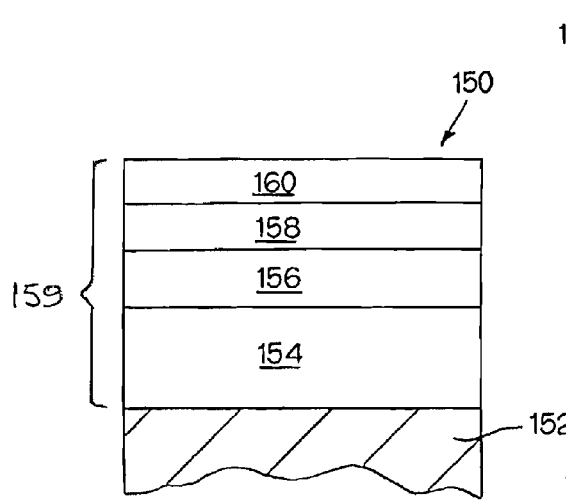
FIG. 5 is a cross-sectional mechanical schematic view of another specific embodiment of a coating scheme on a substrate.

Referring to FIG. 5, there is shown a specific embodiment 150 of a coating scheme 159 on a substrate 152. The coating scheme 159 includes a base coating region 154, which comprises a plurality of pairs of nanolayers, each layer having a thickness equal to less than 100 nanometers, wherein the pair of nanolayers comprises titanium nitride and titanium carbonitride. In the alternative, the base coating region can comprise a plurality of pairs of nanolayers wherein the nanolayers may be titanium oxycarbonitride and titanium nitride or the nanolayers may be titanium oxycarbonitride and titanium carbonitride. The coating scheme 159 further includes a coating layer of MT-CVD titanium carbonitride 156 deposited using processing parameters like those used to deposit the MT-CVD titanium carbonitride coating layer 40 of FIG. 2. The coating scheme 159 further includes a coating layer of titanium oxycarbonitride 158 on the coating layer of MT-CVD titanium carbonitride 156. The processing parameters used to deposit the coating layer of titanium oxycarbonitride 158 are essentially the same as those used to deposit the coating layer of titanium oxycarbonitride 44 of FIG. 2. Finally, the coating scheme 159 includes an outermost coating layer of alpha-alumina 160, which is deposited per processing parameters essentially the same as those used to deposit the alpha-alumina coating layer 46 of FIG. 2.

Figure 5A:
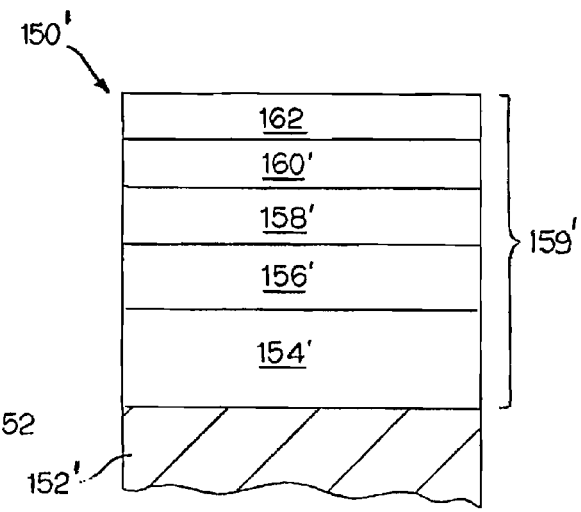
FIG. 5A is a cross-sectional mechanical schematic view of another specific embodiment of a coating scheme on a substrate.

Referring to FIG. 5A, there is shown still another specific embodiment 150' of a coating scheme 159' on a substrate 152'. The coating scheme 159' includes a base coating region 154', a coating layer of MT-CVD titanium carbonitride 156', a coating layer of titanium oxycarbonitride 158' on the coating layer of MT-CVD titanium carbonitride 156', and a coating layer of alpha-alumina 160. The coating layers 154', 156', 158' and 160' are essentially the same as coating layers 154, 156, 158 and 160, respectively, of FIG. 5.

The coating scheme 159' of FIG. 5A further includes an outermost coating layer of titanium nitride 162. There should be an appreciation that in some situations, applicants contemplate the removal of the outermost coating layer of titanium nitride via wet blasting. This is applicable for this embodiment as well as any of the earlier embodiments with an outermost coating layer of titanium nitride. Generally speaking, by wet blasting the titanium nitride to expose the alumina, the stress condition of the exposed alumina layer changes from an initial tensile stress condition to a compressive stress condition. United States Patent Application Publication No. US 2011/0107679 A1 to Sottke et al. and assigned to Kennametal Inc. of Latrobe, Pa. 15650 shows the wet blasting of the outermost coating layer on an alumina coating layer even though the outermost coating layer is not titanium nitride.

In reference to the processing parameters to deposit the titanium nitride coating layer, the gaseous mixture from which the coating layer of titanium nitride is deposited typically comprises (including volume in mol percentages of the gaseous mixture): $TiCl_4$ (0.93 mol %), $N_2$ (18.08 mol %) and $H_2$ (79.11 mol %). The typical temperature range for the CVD deposition of the coating layer of titanium nitride comprises between about 800° C. and about 950° C. Another temperature range for the CVD deposition of the coating layer of titanium nitride comprises between about 850° C. and about 920° C. A preferred temperature for the CVD deposition of the coating layer of titanium nitride equals about 890° C. A typical pressure range for the CVD deposition of the titanium nitride coating layer ranges between about 60 torr and about 380 torr. Another pressure range for the CVD deposition of the titanium nitride coating layer ranges between about 80 torr and about 150 torr. A typical duration range for the CVD deposition of the titanium nitride coating layer ranges between about 10 minutes and about 60 minutes. An alternate duration range for the CVD deposition of the titanium nitride coating layer ranges between about 20 minutes and about 50 minutes. The thickness of the coating layer of titanium nitride is about 0.5 micrometer. One range for the thickness of the coating layer of titanium nitride is between about 0.1 micrometer and about 2 micrometers. Another range for the thickness of the coating layer of titanium nitride is between about 0.2 micrometer and about 1 micrometer.

Applicants contemplate that rather than using an overlayer of titanium nitride on the alumina coating layer, any one of the following overlayer coating schemes could be used: titanium oxycarbonitride/titanium nitride; titanium nitride/titanium carbonitride/titanium nitride; titanium oxycarbonitride/titanium carbonitride/titanium nitride; multilayers of titanium oxycarbonitride/titanium nitride; and multilayers of titanium oxycarbonitride/titanium carbonitride. The process parameters for these various coating materials are the same as those already described herein for these materials.

Applicants further contemplate that the coating scheme may include an outward coating layer. The outward coating layer is selected from the group consisting of: titanium nitride, titanium carbide, titanium carbonitride, hafnium nitride, hafnium carbide, hafnium carbonitride, zirconium nitride, zirconium carbide, and zirconium carbonitride. The outward coating layer is farther away from the substrate than the coating of titanium oxycarbonitride.

Two specific examples of a coated cutting insert with a coating scheme including a coating layer of titanium oxycarbonitride are set forth below. Table A sets forth the parameters for the CVD deposition of base coating layer of titanium nitride, the MT-CVD coating layer of titanium carbonitride, and the titanium oxycarbonitride coating layer.

width). Repeat this procedure for five photographs. The aspect ratios of all intercepted grains are then averaged as the final aspect ratio. Due to finer structure of the prior art, a 20,000× magnification is selected in this case with a field of view equal to 5 micrometers by 6 micrometers.

Figure 8:
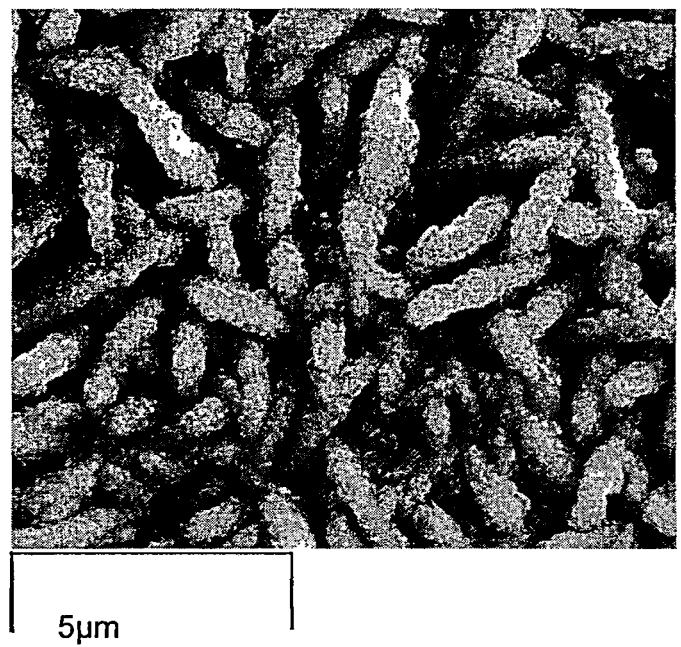
FIG. 8 is a photomicrograph of the surface of the coating layer of titanium oxycarbonitride from Inventive Example No. 2 taken by scanning electron microscopy (SEM) and the photomicrograph has a scale of 5 micrometers.

FIG. 8 is another photomicrograph of the surface of the coating layer of titanium oxycarbonitride from Inventive Example No. 2 taken by scanning electron microscopy (SEM) and the photomicrograph has a scale of 5 micrometers. A review of the photomicrograph (FIG. 6) shows formation of whisker structure with the average of length of 1.54 µm, the average width of 0.49 µm and the average aspect ratio of 3.22.

Applicants contemplate that a coated cutting insert may comprise a substrate that has a coating layer of titanium

TABLE A

Process Steps to Produce Selected Coating Layers for Examples Nos. 1 and 2

| Step | Parameter | | | |
|---|---|---|---|---|
| | Temperature (° C.) Range | Pressure (torr) Range | Total Time (minutes) | Gases Present [mol %] |
| Step 1: Base Layer of Titanium Nitride | 850-920 | 80-150 | 45 | $TiCl_4$ (1.04), $N_2$ (20.39) and $H_2$ (76.45). |
| Step 2: MT-CVD titanium carbonitride Coating Layer | 770-900 | 40-100 | 210 | $TiCl_4$ (0.98), $N_2$ (26.17), $CH_3CN$ (0.61), HCl (1.05) and $H_2$ (71.19). |
| Step 3: titanium oxycarbonitride | 850-920 | 60-500 | 30 | $TiCl_4$ (0.85), $N_2$ (27.11), $CH_3CN$ (0.05), $CH_4$ (4.52), HCl (1.81), CO (0.9), and $H_2$ (63.26). |

Figure 6:
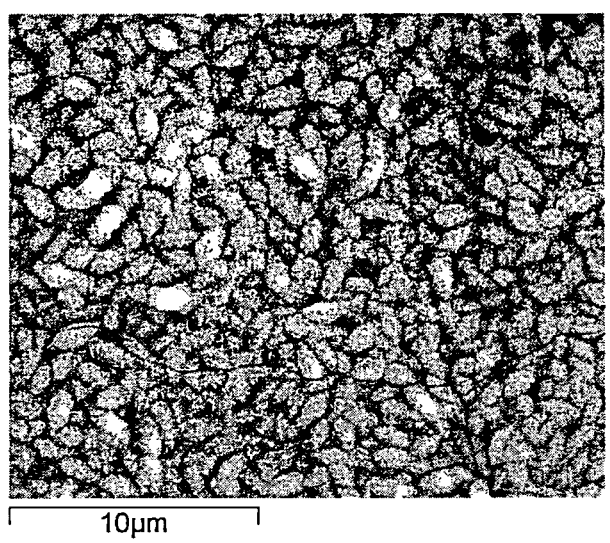
FIG. 6 is a photomicrograph of the surface of the coating layer of titanium oxycarbonitride from Inventive Example No. 1 taken by scanning electron microscopy (SEM) and the photomicrograph has a scale of 10 micrometers.

FIG. 6 is a photomicrograph of the surface of the coating layer of titanium oxycarbonitride from Inventive Example No. 1 taken by scanning electron microscopy (SEM) and the photomicrograph has a scale of 10 micrometers. A review of the photomicrograph (FIG. 4) shows the formation of whisker structure with the average of length of 1.85 µm, the average width of 0.94 µm and the average aspect ratio of 2.05. These average values were determined according to the following technique: One line is randomly drawn on the field of view and the grains intercepted by this line is used for measurement of their length and width, which can be used to calculate the aspect ratio (aspect ratio=length/width). Repeat this procedure for five photographs. The aspect ratios of all intercepted grains are then averaged as the final aspect ratio.

Figure 7:
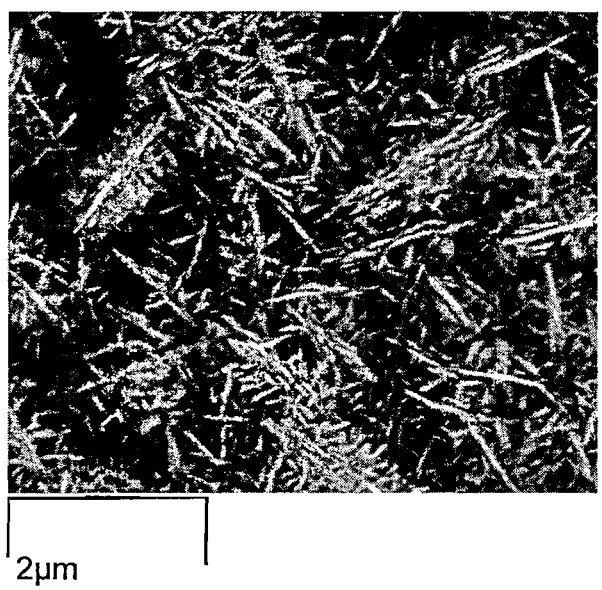
FIG. 7 is one photomicrograph of the surface of the coating layer of titanium oxycarbonitride from the prior art taken by scanning electron microscopy (SEM) and the photomicrograph has a scale of 5 micrometers.

FIG. 7 is a photomicrograph of the surface of the coating layer of titanium oxycarbonitride from the prior art taken by scanning electron microscopy (SEM) and the photomicrograph has a scale of 5 micrometers. A review of the photomicrograph (FIG. 5) shows formation of much finer whisker structure than the inventive samples and its average of length of is 0.3 µm, the average width is 0.06 µm and the average aspect ratio is 5.83. These average values were determined according to the following technique: One line is randomly drawn on the field of view and the grains intercepted by this line is used for measurement of their length and width, which can be used to calculate the aspect ratio (aspect ratio=length/ oxycarbonitride deposited directly on the surface of the substrate. One or more of the following coating overlayers are deposited on the surface of the coating layer of titanium oxycarbonitride: titanium nitride or titanium carbonitride or alpha-alumina. The total thickness of the titanium oxycarbonitride coating layer and the coating overlayer is between about 3 microns and about 4 microns. The titanium oxycarbonitride coating layer has a thickness between about 0.5 microns and about 1 micron. The coating overlayer has a thickness between about 2 microns and about 3 microns.

A wet turning cycle interrupted operation was used as a metalcutting test to compare an inventive cutting insert against a conventional cutting insert. The test had the following parameters: cutting insert CNMA432; workpiece material: 80-55-06 ductile iron; speed equal to 656 surface feet per minute (sfm) [200 surface meters per minute], a feed rate equal to 0.004 inch [0.1 millimeters] per revolution, and a depth of cut equal to 0.08 inch [2.0 millimeters] and a lead angle equal to −5 degrees. Flood coolant. Minutes per cycle 1.01 minutes and passes per cycle equal to 18.

The substrate for the inventive cutting insert and the conventional cutting insert was WC with 6 wt % Co. The process to deposit the inventive coating scheme is shown in Table B below with Steps 2A and 2B repeated 4 times.

TABLE B

Process Steps to Produce Selected Coating Layers for Inventive Example

| Step | Temperature (° C.) Range | Pressure (mb) Range | Total Time (minutes) | Gases Present [mol %] |
|---|---|---|---|---|
| Step 1: Base Layer of Titanium Nitride | 850-920 | 80-150 | 45 | $TiCl_4$ (0.93), $N_2$ (18.08) and $H_2$ (79.11). |
| Step 2A: MT-CVD titanium oxycarbonitride Coating Layer | 850-920 | 60-500 | 60 | $TiCl_4$ (0.70), $N_2$ (25.67), $CH_3CN$ (0.03), $CH_4$ (1.71), HCl (1.431), CO (0.57), and $H_2$ (69.89). |
| Step 2B: MT-CVD titanium carbonitride Coating Layer | 850-920 | 40-100 | 30 | $TiCl_4$ (1.00), $N_2$ (19.3), $CH_3CN$ (0.34), HCl (1.05) and $H_2$ (75.06). |
| Step 3:: titanium oxycarbonitride bonding layer | 850-920 | 60-500 | 60 | $TiCl_4$ (0.70), $N_2$ (25.67), $CH_3CN$ (0.03), $CH_4$ (1.71), HCl (1.431), CO (0.57), and $H_2$ (69.89). |
| Step 4: Alumina Coating Layer | 850-920 | 40-150 | 450 | $AlCl_3$ (1.53), $CO_2$ (9.18), $H_2S$ (0.13), HCl (2.30) and $H_2$ (84.95). |
| Step 5: titanium carbonitride Coating Layer | 850-920 | 60-500 | 60 | $TiCl_4$ (0.89), $N_2$ (27.03), $CH_4$ (9.01) and $H_2$ (63.07). |
| Step 6: titanium nitride Coating Layer | 850-920 | 60-500 | 75 | $TiCl_4$ (0.81), $N_2$ (29.76) and $H_2$ (69.43). |

The coating scheme for the conventional cutting insert comprised: titanium nitride layer/MT-CVD titanium carbonitride layer/titanium oxycarbonitride bonding layer/alumina layer/titanium carbonitride layer/titanium nitride layer. The titanium oxycarbonitride bonding layer and layers above it were deposited at the temperature range 960-1020 (° C.).

Table C below shows the tool life results.

TABLE C

Tool Life for Wet Turning Cycle Interrupted Operation

| Tool | Rep 1 (minutes) | Rep 2 (minutes) | Mean Tool Life (Minutes) |
|---|---|---|---|
| Prior Art | 10.7 | 10.6 | 10.6 |
| Invention | 11.9 | 10.6 | 11.2 |

The failure mode criteria were: 0.012 inches [0.3 millimeters] for uniform wear; 0.012 inches [0.3 millimeters] for maximum wear; 0.012 inches [0.3 millimeters] for nose wear; 0.012 inches [0.3 millimeters] for depth cut notching; 0.012 inches [0.3 millimeters] for trailing edge wear; 0.004 inches [0.1 millimeters] for crater wear.

These tests show 11% improvement of performance of invention compared to prior art in first repetition and equal performance in the second repetition. Both test tools failed by depth cut notching which is a typical failure of the tool in machining ductile cast iron under interrupted conditions. This failure mechanism is related to coating adhesion at the depth of cut. Surprisingly, the invention, with titanium oxycarbonitride bonding layer deposited at moderate temperature using $CH_3CN$ as the catalyst does show slight improved adhesion compare to the prior art with titanium oxycarbonitride bonding layer deposited even at higher temperature.

As discussed above, adhesion of the coating scheme to the substrate is an important feature for a coated cutting insert. It is apparent from the above description that the present invention provides a coated cutting insert that experiences improved adhesion of the coating scheme to the substrate. It is also apparent that the present invention provides a coated cutting insert with a coating scheme including titanium oxycarbonitride that has improved adhesion. Further, it is apparent that the present invention provides a coated cutting insert with a coating scheme including titanium oxycarbonitride that has improved adhesion wherein the titanium oxycarbonitride whiskers have specific range of grain dimension and aspect ratios. It is still further apparent that the present invention provides a coated cutting insert with a coating scheme including a titanium oxycarbonitride coating layer wherein the gaseous mixture used to deposit the titanium oxycarbonitride coating layer has a reduced content of acetonitrile.

The patents and other documents identified herein are hereby incorporated by reference herein. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A coated cutting insert comprising:
a substrate having a surface;
a coating scheme on the surface of the substrate;
the coating scheme including a coating layer of titanium oxycarbonitride wherein the titanium oxycarbonitride comprising titanium oxycarbonitride whiskers having as measured in a two-dimensional plane view an average length greater than about 1.0 μm, an average width greater than about 0.2 μm, and an average aspect ratio greater than about 2.0.

2. The coated cutting insert according to claim 1 wherein the coating layer of titanium oxycarbonitride comprising the titanium oxycarbonitride whiskers having as measured in a two-dimensional plane view the average length being between about 1.5 μm and about 1.9 μm, the average width being between about 0.49 μm and about 0.94 μm, the average aspect ratio being between about 2.0 and about 3.3.

3. The coated cutting insert according to claim 1 wherein the coating scheme further comprising a coating layer of titanium carbonitride, the coating layer of titanium oxycarbonitride being on the coating layer of titanium carbonitride; a coating layer of titanium nitride, and the coating layer of titanium carbonitride being on the coating layer of titanium nitride; a coating layer of alumina on the coating layer of titanium oxycarbonitride; and an outer coating of titanium nitride on the coating layer of alumina.

4. The coated cutting insert according to claim 1 wherein the coating scheme further comprising a multilayer coating region comprising a plurality of pairs of coating layers, and wherein each pair of coating layers comprises a coating layer of titanium carbonitride and the coating layer of titanium oxycarbonitride, the coating scheme further including a coating layer of titanium nitride wherein the multilayer coating region is on the coating layer of titanium nitride, and the coating scheme further including a coating layer of alumina on the multilayer coating region; and the coating scheme further including a coating layer of titanium nitride on the coating layer of alumina.

5. The coated cutting insert according to claim 1 wherein the titanium oxycarbonitride has a formula $Ti(O_xC_yN_z)$ wherein x ranges between about 0.005 and about 0.15, y ranges between about 0.3 and about 0.8, and z ranges between about 0.2 and about 0.8.

6. The coated cutting insert according to claim 1 wherein the titanium oxycarbonitride has a formula $Ti(O_xC_yN_z)$ wherein x ranges between about 0.01 and about 0.1, y ranges between about 0.3 and about 0.6, and z ranges between about 0.3 and about 0.7.

7. The coated cutting insert according to claim 1 wherein the coating scheme further comprising a mediate coating layer, and the mediate coating layer being selected from the group consisting of: titanium nitride, titanium carbide, titanium carbonitride, hafnium nitride, hafnium carbide, hafnium carbonitride, zirconium nitride, zirconium carbide, and zirconium carbonitride wherein the mediate coating layer is mediate of the substrate and the coating of titanium oxycarbonitride.

8. The coated cutting insert according to claim 1 wherein the coating scheme further comprising an outward coating layer, and the outward coating layer being selected from the group consisting of: titanium nitride, titanium carbide, titanium carbonitride, hafnium nitride, hafnium carbide, hafnium carbonitride, zirconium nitride, zirconium carbide, and zirconium carbonitride wherein the outward coating layer is farther away from the substrate than the coating of titanium oxycarbonitride.

9. The coated cutting insert according to claim 1 wherein the substrate being selected from the group consisting of cemented carbides, ceramics, polycrystalline cubic boride (PcBN) and cermets.

10. The coated cutting insert according to claim 1 further comprising a coating layer of alumina on the coating layer of titanium oxycarbonitride.

11. The coated cutting insert according to claim 10 further comprising on the coating layer of alumina an outer overlayer coating scheme region comprising one of the following outer overlayer coating schemes: (A) a coating sequence of a titanium oxycarbonitride coating layer and a titanium nitride coating layer; (B) a coating sequence of a titanium nitride coating layer and a titanium carbonitride coating layer and a titanium nitride coating layer; (C) a coating sequence of a titanium oxycarbonitride coating layer and a titanium carbonitride coating layer and a titanium nitride coating layer; (D) a plurality of coating sets wherein each coating set comprising a titanium oxycarbonitride coating layer and a titanium nitride coating layer; (E) a plurality of coating sets wherein each coating set comprising a titanium oxycarbonitride coating layer and a titanium carbonitride coating layer; and (F) a coating layer of titanium nitride.

12. A coated cutting insert produced by the process comprising the steps of:
providing a substrate with a surface;
depositing by chemical vapor deposition a coating layer of titanium oxycarbonitride from a gaseous mixture comprising:
nitrogen present in an amount between about 5 mol percent and about 40 mol percent,
methane present in an amount between about 0.5 mol percent and about 8.0 mol percent,
hydrogen chloride optionally present in an amount up to about 5.0 mol percent,
titanium tetrachloride present in an amount between about 0.2 mol percent and about 3.0 mol percent,
acetonitrile present in an amount between about 0.02 mol percent and about 0.15 mol percent,
carbon monoxide present in an amount between about 0.4 mol percent and about 2.0 mol percent, and
hydrogen present in an amount between about 41.85 mol percent and about 93.88 mol percent.

13. The coated cutting insert according to claim 12 wherein the coating layer of titanium oxycarbonitride comprises titanium oxycarbonitride whiskers having as measured in a two-dimensional plane view an average length greater than about 1.0 μm, an average width greater than about 0.2 μm, and an average aspect ratio greater than about 2.0.

14. The coated cutting insert according to claim 12 wherein the coating layer of titanium oxycarbonitride comprising the titanium oxycarbonitride whiskers having as measured in a two-dimensional plane view the average length being between about 1.5 μm and about 1.9 μm, the average width being between about 0.49 μm and about 0.94 μm, the average aspect ratio being between about 2.0 and about 3.3.

15. The coating cutting insert according to claim 12 wherein the depositing step deposits the titanium oxycarbonitride on the surface of the substrate; and the process further comprising the step of depositing on the coating layer of titanium oxycarbonitride one of the following coating overlayers titanium nitride or titanium carbonitride or alpha-alumina wherein the coating overlayer has a thickness between about 1 microns and about 3 microns.

* * * * *